(12) United States Patent
Richter et al.

(10) Patent No.: US 12,313,714 B2
(45) Date of Patent: May 27, 2025

(54) THREE-DIMENSIONAL DIFFUSION WEIGHTED MAGNETIC RESONANCE IMAGING

(71) Applicant: Siemens Healthcare GmbH, Erlangen (DE)

(72) Inventors: Julian Richter, Hessdorf (DE); Manuel Stich, Parkstein (DE)

(73) Assignee: Siemens Healthineers AG, Erlangen (DE)

( * ) Notice: Subject to any disclaimer, the term of this patent is extended or adjusted under 35 U.S.C. 154(b) by 158 days.

(21) Appl. No.: 18/120,541

(22) Filed: Mar. 13, 2023

(65) Prior Publication Data

US 2023/0288510 A1    Sep. 14, 2023

(30) Foreign Application Priority Data

Mar. 14, 2022 (EP) ..................... 22161935

(51) Int. Cl.
| | | |
|---|---|---|
| *G01V 3/00* | (2006.01) | |
| *G01R 33/48* | (2006.01) | |
| *G01R 33/561* | (2006.01) | |
| *G01R 33/563* | (2006.01) | |

(52) U.S. Cl.
CPC ..... *G01R 33/4826* (2013.01); *G01R 33/5618* (2013.01); *G01R 33/56341* (2013.01)

(58) Field of Classification Search
CPC ............ G01R 33/4826; G01R 33/5618; G01R 33/56341
USPC ........................................................ 324/309
See application file for complete search history.

(56) References Cited

U.S. PATENT DOCUMENTS

| | | | |
|---|---|---|---|
| 2013/0181712 A1 | 7/2013 | Sutton et al. | |
| 2017/0176562 A1* | 6/2017 | Li | .......... G01R 33/543 |
| 2019/0346522 A1* | 11/2019 | Botnar | ............... G01R 33/5676 |

FOREIGN PATENT DOCUMENTS

| | | | | |
|---|---|---|---|---|
| CN | 109696647 A | * | 4/2019 | ............. A61B 5/055 |
| EP | 2728371 A1 | * | 5/2014 | ......... G01R 33/4822 |
| JP | 6408594 B2 | * | 10/2018 | ......... G01R 33/4835 |
| WO | WO-2010116782 A1 | * | 10/2010 | ........... G01R 33/485 |
| WO | WO-2011030239 A1 | * | 3/2011 | ......... G01R 33/4824 |
| WO | WO-2015057745 A1 | * | 4/2015 | ......... G01R 33/4824 |

OTHER PUBLICATIONS

KR 20150018271 A (No Name) (Year: 2015).*

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

Techniques are provided for performing three-dimensional diffusion weighted magnetic resonance imaging. A diffusion gradient is applied by controlling a gradient coil arrangement of an MRI system and, during an acquisition period after the application of the diffusion gradient, a readout gradient is applied by controlling the gradient coil arrangement and MR data is acquired. For applying the readout gradient, the gradient coil arrangement is controlled such that the MR data is acquired at least along a trajectory segment of a three-dimensional k-space trajectory, wherein a k-space center is sampled by the trajectory segment multiple times during the acquisition period.

20 Claims, 2 Drawing Sheets

(56) References Cited

OTHER PUBLICATIONS

Hugger T. et al.: "Fast Undersampled Functional Magnetic Resonance Imaging Using Nonlinear Regularized Parallel Image Reconstruction", PLoS ONE 6(12): e28822; Dec. 2011.

Bucholz Elizabeth K. et al: "Multispectral Imaging With Three-Dimensional Rosette Trajectories", Magnetic Resonance In Medicine, vol. 59, No. 3, Feb. 27, 2008, pp. 81-589, XP055951139; 2008.

Tounekti, S. et al., "High-Resolution 3D Diffusion Tensor MRI of Anesthetized Rhesus Macaque Brain at 3T", NeuroImage 2018;181(1):149-161.

Holtrop J.L. et al., "High Spatial Resolution Diffusion Weighted Imaging on Clinical 3 T MRI Scanners Using Multislab Spiral Acquisitions", Journal of Medical Imaging 2016;3(2):023501.

Wu et al.: "Diffusion-Prepared 3D Gradient Spin-Echo Sequence For Improved Oscillating Gradient Diffusion MRI", Magnetic Resonance in Medicine 2020, DOI: 10.1002/mrm.28401.

Fair M.J. et al., "Diffusion-PEPTIDE: Distortion- and Blurring-Free Diffusion Imaging with Self-Navigated Motion-Correction And Relaxometry Capabilities", Magn Reson Med 2021;85:2417-2433.

Bucholz E.K .et al., "Multispectral Imaging With Three-Dimensional Rosette Trajectories", Magnetic Resonance in Medicine 2008;59:581-589.

Pipe, James G. "Motion Correction with PROPELLER MRI: Application to Head Motion and Free-Breathing Cardiac Imaging", Magnetic Resonance in Medicine, vol. 42, No. 5, pp. 963-969, 1999.

Gmitro, Arthur F. et al: "Radial GRASE: Implementation and applications", Magnetic Resonance in Medicine, vol. 53, No. 6, Jan. 1, 2005, pp. 1363-1371, XP055435331; 2005.

\* cited by examiner

THREE-DIMENSIONAL DIFFUSION WEIGHTED MAGNETIC RESONANCE IMAGING

CROSS-REFERENCE TO RELATED APPLICATIONS

The present application claims priority to and the benefit of Europe patent application no. EP 22161935.6, filed on Mar. 14, 2022, the contents of which are incorporated herein by reference in their entirety.

TECHNICAL FIELD

The present disclosure is directed to a method for three-dimensional diffusion weighted magnetic resonance imaging, wherein a diffusion gradient is applied by controlling a gradient coil arrangement of an MRI system and, during an acquisition period after the application of the diffusion gradient, a readout gradient is applied by controlling the gradient coil arrangement and MR data is acquired. The disclosure is further directed to a corresponding MRI system.

BACKGROUND

Magnetic resonance (MR) imaging systems are imaging devices that use a strong external magnetic field to align nuclear spins of an object under examination and excite them to precess about the corresponding alignment by means of applying an excitation RF pulse. The precession or the transition of the spins from this excited state to a state with lower energy, respectively, generates an alternating electromagnetic field in response, which can be detected via receiving antennas as an MR signal.

With the aid of magnetic gradient fields, a position encoding can be impressed on the signals, which subsequently allows the received signal to be assigned to a volume element of the object under investigation. The received signal can then be analyzed, for example to provide an image representation of the object under examination.

Diffusion-weighted MR imaging, denoted as DWI in the following, exploits the diffusion of water molecules in the object, in particular in tissue of a human or animal, due to Brownian motion. Different types of materials or tissues exhibit different respective diffusion coefficients. Therefore, imaging a measure for the spatial variation of diffusion is particularly useful for tissue characterization.

DWI has become an important imaging technique in the diagnosis and staging of tumors, for example, and is implemented in many MR imaging protocols. Since diffusion encoding is time-consuming, fast image acquisition techniques are desirable to achieve high image quality in clinically-acceptable scan times.

Conventionally, two-dimensional echo planar imaging (EPI) serves as the basis of diffusion-weighted MRI protocols. Single-Shot EPI (SS-EPI) is an MR imaging technique that allows for the acquisition of multiple k-space lines N in one single shot. As such, it is well suited for fast imaging. SS-EPI based pulse sequences, however, suffer from magnetic susceptibility-related image artifacts, in particular distortion. The degree of distortion in SS-EPI depends largely on the time required to capture adjacent k-space lines, also denoted by echo spacing, ES. The signal-to-noise ratio (SNR) on the other hand, is governed by the echo train length (ETL), which is given by the total number N of k-space lines multiplied by ES: ETL=N*ES.

As a consequence, DWI protocols used in clinical practice are based on two-dimensional SS-EPI pulse sequences to keep the ETL short and the distortions low. Three-dimensional SS-EPI pulse sequences would require a much longer echo train length, leading to increased sensitivity to signal decay, and thereby to a reduced SNR. In general, however, it is desirable to use three-dimensional pulse sequences, because of the inherently larger higher SNR as seen from the encoding point of view.

SUMMARY

It is an objective of the present disclosure to provide an improved concept for diffusion weighted magnetic resonance imaging, which achieves a larger signal-to-noise-ratio. This objective is achieved by the embodiments as discussed throughout this disclosure, including the subject matter of the claims.

The disclosure is based on the idea of using three-dimensional diffusion weighted magnetic resonance imaging and to acquire, after applying a diffusion gradient, MR data along a trajectory segment of a three-dimensional k-space trajectory, which samples the k-space center multiple times.

According to an embodiment of the disclosure, a method for a three-dimensional diffusion weighted magnetic resonance imaging (DWI) is provided. Therein, a diffusion gradient is applied by controlling a gradient coil arrangement of an MRI system and, during an acquisition period, e.g. a continuous acquisition period, after the application of the diffusion gradient, a readout gradient is applied by controlling the gradient coil arrangement and MR data is acquired, e.g. during the application of the readout gradient. For applying the readout gradient, the gradient coil arrangement is controlled such that the MR data is acquired at least along a trajectory segment of a three-dimensional k-space trajectory, e.g. along a three-dimensional trajectory segment of the three-dimensional k-space trajectory, wherein a k-space center is sampled by the trajectory segment multiple times during the acquisition.

Since the k-space trajectory is a three-dimensional k-space trajectory, no component, e.g. no Cartesian component, of the k-space trajectory is constant along the whole k-space trajectory. In addition, three-dimensional magnetic resonance imaging (MRI), including three-dimensional DWI, inherently includes imaging or data acquisition from a volume, which has a finite extension in slice direction, for example, which includes multiple slices. Such volumes may be denoted as "slabs."

The trajectory segment is, in general, also a three-dimensional segment. However, depending on how the full k-space trajectory is segmented, which is divided into the trajectory segment and one or more further trajectory segments, the trajectory segment may also lie within a certain plane within k-space.

In an embodiment, the trajectory segment is not identical to the whole three-dimensional k-space trajectory and, consequently, the k-space trajectory consists of the trajectory segment and one or more further trajectory segments. Acquiring the MR data along the trajectory segment may therefore be considered as a part of an overall acquisition of overall MR data, which includes the MR data for the trajectory segment and respective further MR data for the one or more further trajectory segments. In other words, the acquisition of the overall MR data may be considered as a segmented data acquisition, and acquiring the MR data along the trajectory segment is part of the segmented data acquisition. The segmented data acquisition may also be denoted as segmented k-space acquisition, e.g. as a three-dimensional segmented k-space acquisition.

In an embodiment, the gradient coil arrangement is controlled to acquire the respective further MR data along the one or more further trajectory segments prior to acquiring the MR data according to the trajectory segment and/or acquiring the MR data according to the trajectory segment.

However, in any case, the k-space center is sampled multiple times, e.g. twice or more often, by the trajectory segment alone.

A sampling of the k-space center, which is the origin of the k-space where the k-vector is equal to (0,0,0), may be understood such that the trajectory segment passes through the k-space center or starts at the k-space center or ends at the k-space center. For example, if the trajectory segment samples the k-space center twice, the trajectory segment may start and end at the k-space center. The trajectory segment may, however, also start at the k-space center, pass through the k-space center, and then end at a point in k-space, which is not the k-space center. The trajectory segment may also start at a point in k-space, which is not the k-space center, pass through the k-space center, and then end at the k-space center. If the trajectory segment samples the k-space center three times, the trajectory segment may start and end at the k-space center and in between the trajectory segment may pass through the k-space center. However, the trajectory segment does not necessarily start or end at the k-space center. The trajectory segment may also pass the k-space center twice or more often without starting or ending at the k-space center.

Applying the diffusion gradient, which may also be denoted as a diffusion gradient pulse or a diffusion encoding module, may comprise applying respective diffusion gradient lobes along one or more directions, e.g. along one or more physical or logical or anatomical axes. For example, one or more gradient lobes may be applied prior to a corresponding RF pulse for the diffusion encoding, and one or more respective diffusion gradient lobes may be applied after the RF pulse for the diffusion encoding symmetrically to the one or more gradient lobes prior to the RF pulse, e.g. with the same polarity or with opposite polarity. Depending on the diffusion gradient direction, gradient lobes in different or multiple direction may also be applied at the same time. In general, the application of the diffusion gradient may be carried out in a conventional manner as known for DWI.

The term radio frequency (RF) is used herein with the common meaning in the context of MR imaging. The frequency of RF pulses is usually on the order of magnitude of the Larmor frequency of the nuclear spins to be excited, for example, in the range of 10 MHz to several 100 MHz, depending on the magnitude of the ground magnetic field.

Although not explicitly mentioned above, prior to the application of the diffusion gradient, an excitation RF pulse is applied, e.g. a RF pulse with a 90° flip angle, to generate a measurable MR signal.

As discussed herein, an acquisition period may be understood as a continuous period of time during which no RF pulses such as refocusing pulses or excitation pulses are applied. In other words, in the case that refocusing pulses are used, these are understood to separate different acquisition periods from each other, e.g. acquisition of different segments of the k-space trajectory.

During the acquisition period, as described with respect to the method embodiment above, the readout gradient is applied to realize the trajectory segment. The one or more further trajectory segments may be sampled during respective one or more further acquisition periods. During an acquisition period or further acquisitions, a readout coil arrangement comprising one or more readout coils, a corresponding control unit and/or readout circuitry, such as an analog-to-digital converter, ADC, may also be activated to detect the corresponding MR signal and to generate the MR data accordingly.

Based on the MR data acquired during the acquisition period and, e.g., based on the further MR data acquired during further acquisition periods according to the further trajectory segments, or more MR images, e.g. real space images, of the object to be imaged may be generated, e.g. by at least one computing unit of the MRI system.

The method enables the use of a longer echo train length, since $T2^*$-related effects can be greatly reduced. In this way, the inherent advantages of three-dimensional data acquisition with respect to the SNR may be exploited.

Due to the three-dimensional imaging, the excitation pulse, in combination with the corresponding slice selection gradient, excite nuclear spins not only in a single slice but in a slab of two or more adjacent slices. Therefore, the MR signal detected and the corresponding MR data generated based on the detected MR signal origins from a three-dimensional volume in the object to be imaged, which leads to an increased SNR.

An advantage of the method embodiment according to the disclosure results from the fact that the k-space center is sampled multiple times along the trajectory segment. Usually, for example for three-dimensional MR imaging, dedicated navigator scans are carried out to account for phase shifts between different slabs or slices being acquired. These navigator scans may scan a region around the k-space center, which allows for a corresponding compensation of phase-shift effects. According to the method embodiment, the three-dimensional k-space trajectory and, e.g. the trajectory segment, already samples the k-space center inherently multiple times, and therefore necessarily also a region around the exact k-space center. Therefore, the MR data inherently comprises information, which otherwise would have to be gathered by means of dedicated navigator scans. The use of such navigator scans requires additional time, and therefore limits the time that is available for actual k-space signal acquisition or MR data acquisition and/or the SNR of that signal due to the $T2^*$ signal decay.

According to the embodiments of the disclosure, however, the MR signal itself acts as an effective navigator signal and acquiring the MR data along the trajectory segment as described renders a dedicated navigator scan unnecessary.

For example, the method for three-dimensional DWI may be carried out as a turbo-gradient-spin-echo (TGSE) acquisition, or in other words according to a TGSE technique.

For example, for acquiring and measuring a given slab of slices, two or more shots, each shot corresponding to an excitation RF pulse, and one or more, e.g. two or more, acquisition periods separated by respective refocusing pulses per shot may be used. For a given slab, the overall k-space trajectory may then be sampled over the two or more shots.

According to several implementations of the method, for each of the multiple samplings of the k-space center, the trajectory segment passes the k-space center, ends at the k-space center, or starts at the k-space center.

Passing the k-space center may, e.g., be understood such that first the vector of k is a first vector of non-zero length, becomes the zero vector, and afterwards becomes a second vector of non-zero length, which is, in general, different from the first vector of non-zero length.

According to several implementations, the multiple samplings of the k-space center correspond to multiple directions of the trajectory segment.

In other words, each time the k-space is sampled, the trajectory segment approaches the k-space center from a different direction or leaves the k-space center in a different direction. Therein, the direction of the trajectory segment may be understood according to a linear approximation of the trajectory segment at the k-space center.

Sampling the k-space center according to different directions during the sampling according to the trajectory segment has the advantage that the region surrounding the k-space center is sampled more exhaustively, which provides more information for compensating phase shifts or phase deviations as explained above with respect to the effective navigator signal.

For example, the trajectory segment comprises or consists of a radial spoke starting at and ending at the k-space center. The radial spoke may be understood as a type of curve, which leaves the k-space center approximately linearly, ends to form a loop, and then approaches the k-space center again approximately linearly to end at the k-space center. However, the trajectory segment may also comprise multiple of such radial spokes.

For example, the k-space trajectory may be implemented as a three-dimensional rosette trajectory, which consists of a plurality of such radial spokes in different directions in the k-space.

According to several implementations, the trajectory segment is represented by the following Equations:

$$k_x = k_{max} \sin(2\pi f_1 t)\cos(2\pi f_2 t)\cos(2\pi f_3 t),$$

$$k_y = k_{max} \sin(2\pi f_1 t)\sin(2\pi f_2 t)\cos(2\pi f_3 t),$$

$$k_z = k_{max} \sin(2\pi f_1 t)\sin(2\pi f_3 t),$$

wherein $k_{max}$ represents a predefined maximum radial distance from the k-space center, $f_1$ represents a predefined first frequency, $f_2$ represents a predefined second frequency, $f_3$ represents a predefined third frequency, wherein the first frequency differs from the second frequency and/or the first frequency differs from the third frequency. In other words, the trajectory segment is a part of the rosette trajectory as mentioned above.

The k-space trajectory may for example be considered as a curve $(k_x, k_y, k_z)(t) = (k_x(t), k_y(t), k_z(t))$ for $t=0 \ldots T$ (e.g. for $0 \leq t \leq T$), wherein $T = 1/\min(f_1, f_2, f_3)$.

The rosette trajectory defined in this way has the particular advantage that it inherently passes the k-space center multiple times, and also in a relatively high density around the k-space center.

In principle, however, other types of trajectories are also possible, such as for example spiral type trajectories, etc.

According to various embodiments, the first frequency differs from the second frequency, the first frequency differs from the third frequency, and the second frequency differs from the third frequency. In other words, the first, the second, and the third frequency are all different from each other.

For example, the first frequency may be greater than the second frequency and the first frequency may also be greater than the third frequency. As another example, the first frequency may be greater than the second frequency and the second frequency may be greater than the third frequency.

According to various embodiments, after the acquisition period, a refocusing RF pulse is applied. During a further acquisition period, e.g. a continuous further acquisition period, after the application of the refocusing RF pulse, a further readout gradient is applied by controlling the gradient coil arrangement, and further MR data is acquired during the application of the further readout gradient. For applying the further readout gradient, the gradient coil arrangement is controlled such that the further MR data is acquired along a further trajectory segment of the k-space trajectory, wherein the further trajectory segment differs from the trajectory segment. The k-space center is sampled by the further trajectory segment multiple times during the further acquisition period.

The trajectory segment and the further trajectory segment e.g. do not overlap but may be connected to each other. In other words, the end of the trajectory segment may correspond to the beginning of the further trajectory segment.

In an analogous manner, further refocusing pulses and yet further trajectory segments may be sampled after the trajectory segment and the further trajectory segment within the same shot. Optionally, one or more additional shots may be applied to acquire yet further trajectory segments of the k-space trajectory.

By using the refocusing pulses between any adjacent acquisition periods within a single shot, the echo train length may be significantly increased.

According to various embodiments, prior to the application of the diffusion gradient, a slice selection gradient is applied to excite a slab corresponding to two or more adjacent slices of the object to be imaged. An MR signal emitted by the excited slab is detected during the acquisition period in order to acquire the MR data.

Analogously, a further MR signal may for example be emitted by the excited slab and be detected during the further acquisition period to acquire the further MR data.

According to various embodiments, a plurality of slabs, e.g. three or more slabs, each slab corresponding to two or more respective slices of the object to be imaged, is excited in a predefined order. Therein, between each pair of subsequently excited slabs of the plurality of slabs at least one further slab of the plurality of slabs is located.

For instance, the plurality of slabs may be adjacent to each other. In other words, the plurality of slabs consists of a plurality of adjacent slices of the object.

By exciting the slabs in the order as described above, it is ensured that two slabs located next to each other are never excited directly one after the other. This is particularly beneficial since it ensures that for acquiring data from a certain slab, no signals from the previously excited slab are taken into account unintentionally due to the spatial separation of the subsequently-excited slabs.

According to various embodiments, a three-dimensional image reconstruction is carried out depending on the MR data and, if applicable, depending on the further MR data, etc.

According to various embodiments, the three-dimensional image reconstruction is carried out without using data acquired by means of a navigator scan.

According to a further aspect of the disclosure, an MRI system for a three-dimensional diffusion weighted magnetic resonance imaging is provided. The MRI system comprises a gradient coil arrangement and at least one control unit, which is configured to control the gradient coil arrangement to apply a diffusion gradient. The at least one control unit is configured to control the gradient coil arrangement to apply a readout gradient during an acquisition period after the application of the diffusion gradient. The MRI system further comprises a readout coil arrangement, which is configured to acquire MR data during the acquisition period, e.g. during the application of the readout gradient. The at least one control unit is configured to control the gradient coil arrangement for applying the readout gradient, such that the MR data is acquired along a trajectory segment of a three-dimensional k-space trajectory, wherein a k-space center is sampled by the trajectory segment multiple times during the acquisition period.

According to various embodiments of the MRI system, the MRI system comprises a sending coil arrangement. The at least one control unit is configured to control the sending coil arrangement to apply a refocusing RF pulse after the acquisition period and to control the gradient coil arrangement to apply a further readout gradient during a further acquisition period after the application of the refocusing RF pulse. The readout coil arrangement is configured to acquire further MR data during the further acquisition period, e.g. during the application of the further readout gradient. The at least one control unit is configured to control the gradient coil arrangement for applying the further readout gradients, such that the further MR data is acquired along a further trajectory segment of the k-space trajectory. The further trajectory segment differs from the trajectory segment. The k-space center is sampled by the further trajectory segment multiple times during the further acquisition period.

According to various embodiments of the MRI system, the MRI system comprises a computing unit, which is configured to carry out a three-dimensional image reconstruction depending on the MR data.

Further embodiments of the MRI system according to the disclosure follow directly from the various embodiments of the method according to the disclosure, and vice versa. For example, individual features and corresponding explanations relating to the various embodiments of the method according to the disclosure can be transferred analogously to corresponding embodiments of the MRI system according to the disclosure. For example, the MRI system according to the disclosure is designed or programmed to carry out the method according to the disclosure. As another example, the MRI system according to the disclosure carries out the method according to the disclosure.

According to a further embodiment of the disclosure, a computer program comprising instructions is provided. When the instructions are executed by an MRI system according to the disclosure, e.g. by the at least one computing unit of the MR-imaging system and/or the at least one control unit of the MR-imaging system, the instructions cause the MRI system to carry out a method for three-dimensional diffusion weighted magnetic resonance imaging according to the disclosure.

According to a further embodiment of the disclosure, a computer-readable storage medium storing the computer program according to the disclosure is provided.

The computer program and the computer-readable storage medium may be considered as respective computer program products comprising the instructions.

A computing unit may e.g. be understood as a data processing device, which comprises processing circuitry. The computing unit can therefore e.g. process data to perform computing operations. This may also include operations to perform indexed accesses to a data structure, for example a look-up table (LUT). A control unit can therefore also represent or contain a computing unit or be part of a computing unit.

For instance, the computing unit may include one or more computers, one or more microcontrollers, and/or one or more integrated circuits, for example, one or more application-specific integrated circuits (ASICs), one or more field-programmable gate arrays (FPGAs), and/or one or more systems on a chip (SoCs). The computing unit may also include, for example, one or more processors, for example one or more microprocessors, one or more central processing units (CPUs), one or more graphics processing units (GPUs), and/or one or more signal processors, e.g. one or more digital signal processors (DSPs). The computing unit may also include a physical or a virtual cluster of computers or other of said units.

In various embodiments, the computing unit includes one or more hardware and/or software interfaces and/or one or more memory units.

A memory unit may be implemented as a volatile data memory, for example a dynamic random access memory (DRAM), or a static random access memory (SRAM), or as a non-volatile data memory, for example a read-only memory (ROM), a programmable read-only memory (PROM), an erasable read-only memory (EPROM), an electrically erasable read-only memory (EEPROM), a flash memory or flash EEPROM, a ferroelectric random access memory (FRAM), a magnetoresistive random access memory (MRAM), a phase-change random access memory (PCRAM), etc.

If it is mentioned in the present disclosure that a component of the MRI system according to the disclosure, e.g. the at least one control unit or the computing unit of the MRI system, is adapted, configured, designed to, etc., perform or realize a certain function, to achieve a certain effect, or to serve a certain purpose, this can be understood such that the component, beyond being usable or suitable for this function, effect, or purpose in principle or theoretically, is concretely and actually capable of executing or realizing the function, achieving the effect, or serving the purpose by a corresponding adaptation, programming, physical design, and so on.

Further features of the disclosure are apparent from the claims, the figures, and the figure description. The features and combinations of features mentioned above in the description as well as the features and combinations of features mentioned below in the description of figures and/or shown in the figures may be comprised by the disclosure not only in the respective combination stated, but also in other combinations. For example, embodiments and combinations of features, which do not have all the features of an originally-formulated claim, may also be comprised by the disclosure. Moreover, embodiments and combinations of features which go beyond or deviate from the combinations of features set forth in the recitations of the claims may be comprised by the disclosure.

BRIEF DESCRIPTION OF THE DRAWINGS

In the following, the disclosure will be explained in detail with reference to specific exemplary embodiments and respective schematic drawings. In the drawings, identical or functionally identical elements may be denoted by the same reference signs. The description of identical or functionally-identical elements is not necessarily repeated with respect to different figures.

In the figures.

DETAILED DESCRIPTION OF THE DISCLOSURE

Figure 1:
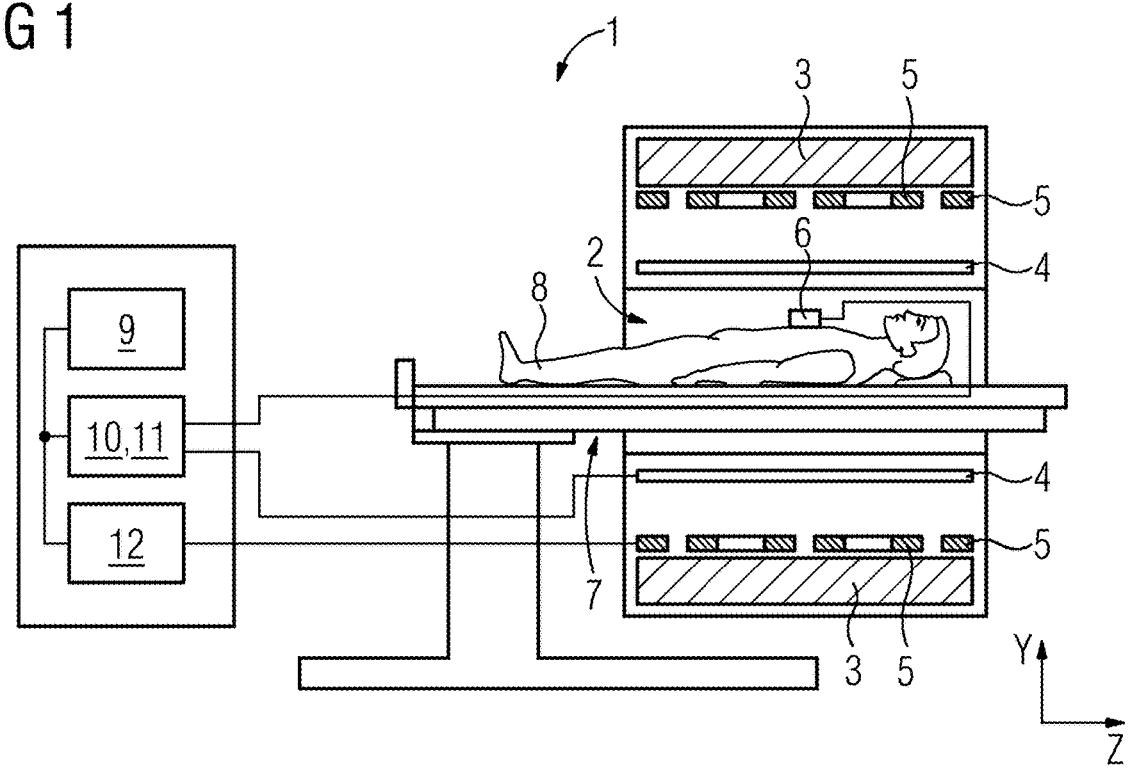
FIG. 1 illustrates a schematic representation of an exemplary implementation of an MRI system, according to one or more embodiments of the disclosure.

FIG. 1 illustrates a schematic representation of an exemplary implementation of an MRI system 1 according to one or more embodiments of the disclosure.

The MRI system 1 comprises a magnet unit with a field magnet 3 that generates a static magnetic field for aligning nuclear spins of an object 8, for example a patient, in an recording region. The recording region is characterized by an extremely homogeneous static magnetic field, the homogeneity relating in particular to the magnetic field strength or its magnitude. The recording region is positioned in a patient tunnel 2 extending in a longitudinal direction Z through the magnet unit. The field magnet 3 may, for example, be a superconducting magnet capable of providing magnetic fields with a magnetic flux density of up to 3 T or more. However, permanent magnets or electromagnets with normal conducting coils may be used for lower field strengths. A patient table 7 may be movable within the patient tunnel 2.

Furthermore, the magnet unit comprises a gradient coil arrangement 5 with several gradient coils that are designed to superimpose location-dependent magnetic fields in the three spatial directions on the static magnetic field for spatial differentiation of the sensed imaging regions in the recording region. The gradient coils of the gradient coil arrangement 5 may, for example, be designed as coils of normal conducting wires, which may, for example, generate mutually-orthogonal fields or field gradients in the recording region.

The magnet unit comprises a sending (i.e. transmitting) coil arrangement, which may for example comprise a body coil 4 as a transmitting antenna, which is configured to radiate a radio frequency (RF) signal into the recording region. The body coil 4 may also be used, in some embodiments, to receive resonant MR signals emitted by the object 8. In this case, the body coil 4 may also be considered as a part of a readout coil arrangement of the MRI system 1. Optionally, the readout coil arrangement comprises a local coil 6, which may be arranged in the immediate vicinity of the object 8, for example on the object 8 or in the patient table 7. The local coil 6 may serve as a receiving antenna alternatively or in addition to the body coil 4.

The MRI system 1 also comprises a control and computing system, which may alternatively be referred to herein as a controller, control circuitry, or a control computer. The control and computing system may comprise a readout control unit 10 (also referred to herein as readout control circuitry), which may be considered as a part of the readout coil arrangement and is connected to the body coil 4 and/or the local coil 6. Depending on the detected MR signals, the readout control unit 10, which may comprise an analog-to-digital converter (ADC), may generate corresponding MR data, e.g. in k-space. A computing unit 9 (also referred to herein as a computer or processing circuitry) of the control and computing system may evaluate the MR data and, for example, carry out three-dimensional image reconstruction.

The control and computing system comprises a sending control unit 11 (also referred to herein as sending or transmission control circuitry), which is connected to and controls the body coil 4 to generate RF pulses, such as excitation pulses and/or refocusing pulses. The control and computing system comprises a gradient control unit 12 (also referred to herein as gradient control circuitry), which is connected to and controls the gradient coil arrangement 5 to apply slice selection gradients, gradients for frequency and/or phase encoding, diffusion gradients, and/or readout gradients.

It is noted that the described structure of the control and computing system is provided by way of example and not limitation. The different required tasks and functions may also be distributed differently and/or to different control units and/or other computing units.

Figure 2:
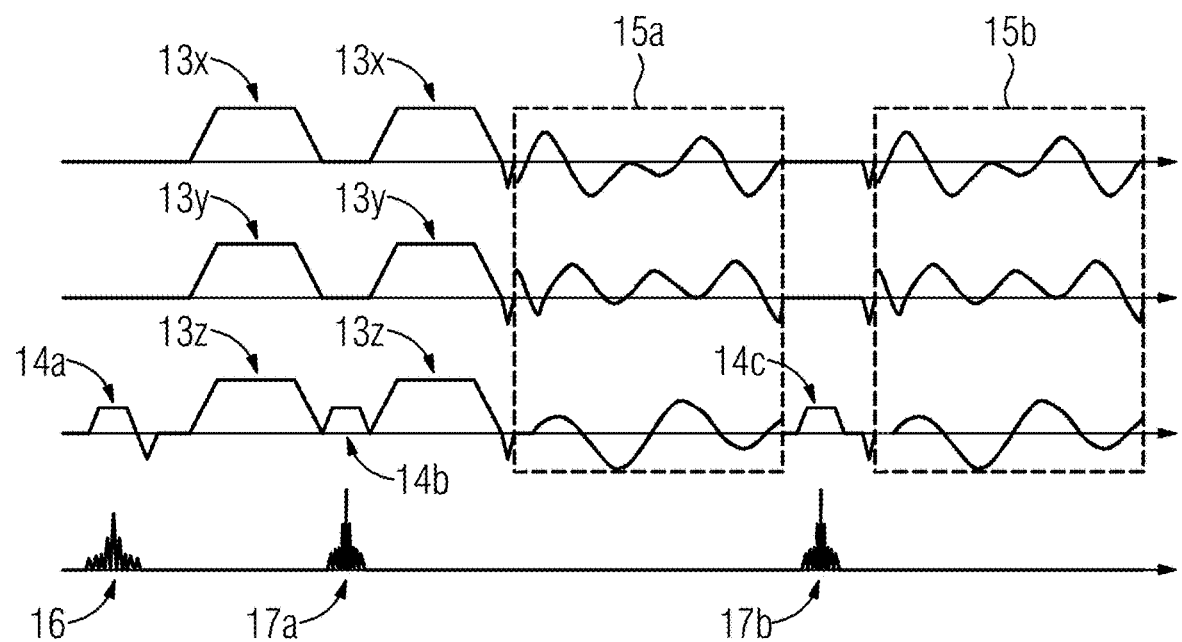
FIG. 2 illustrates schematically a pulse diagram according to an exemplary implementation of a method according to one or more embodiments of the disclosure.

The MRI system 1 is configured to carry out a method for three-dimensional DWI according to the various embodiments of the disclosure. To this end, as shown schematically in the pulse diagram of FIG. 2, a diffusion gradient 13$x$, 13$y$, 13$z$ is applied by controlling the gradient coil arrangement 5, e.g. after the application of an excitation RF pulse 16 by means of the sending coil arrangement. Slice selection gradients 14$a$ may be applied by the gradient coil arrangement 5 to excite a specific slab of slices of the object 8. In FIG. 2, the first line corresponds for example to a gradient in X-direction, the second line corresponds for example to a gradient in Y-direction, and the third line corresponds for example to a gradient in Z-direction. However, the depicted gradients 13$x$, 13$y$, 13$z$ in all three axes X, Y, Z are shown by way of example and not limitation. Depending on the current diffusion gradient directions, different combinations of one, two, or three of the axes X, Y, Z are possible. The fourth line in FIG. 2 corresponds to RF pulses being applied.

In an embodiment, diffusion gradient lobes may be applied symmetrically around an RF pulse 17$a$ for diffusion encoding, for example an RF pulse 17$a$ with a flip angle of approximately 180°. A gradient pulse 14$b$ may also be applied in slice selection direction, for example along the Z-axis, together with the RF pulse 17$a$.

During an acquisition period after the application of the diffusion gradient 13$x$, 13$y$, 13$z$, a readout gradient 15$a$ is applied by controlling the gradient coil arrangement 5, and MR data is acquired during the acquisition period.

In an embodiment, after the acquisition period a refocusing RF pulse 17$b$, for example with a flip angle of approximately 180°, is applied, e.g. together with a gradient pulse 14$c$ in slice selection direction, for example along the Z-axis. After the application of the refocusing RF pulse 17$b$, a further readout gradient 15$b$ is applied by controlling the gradient coil arrangement 5 and further MR data is acquired during the further acquisition period.

Figure 3:
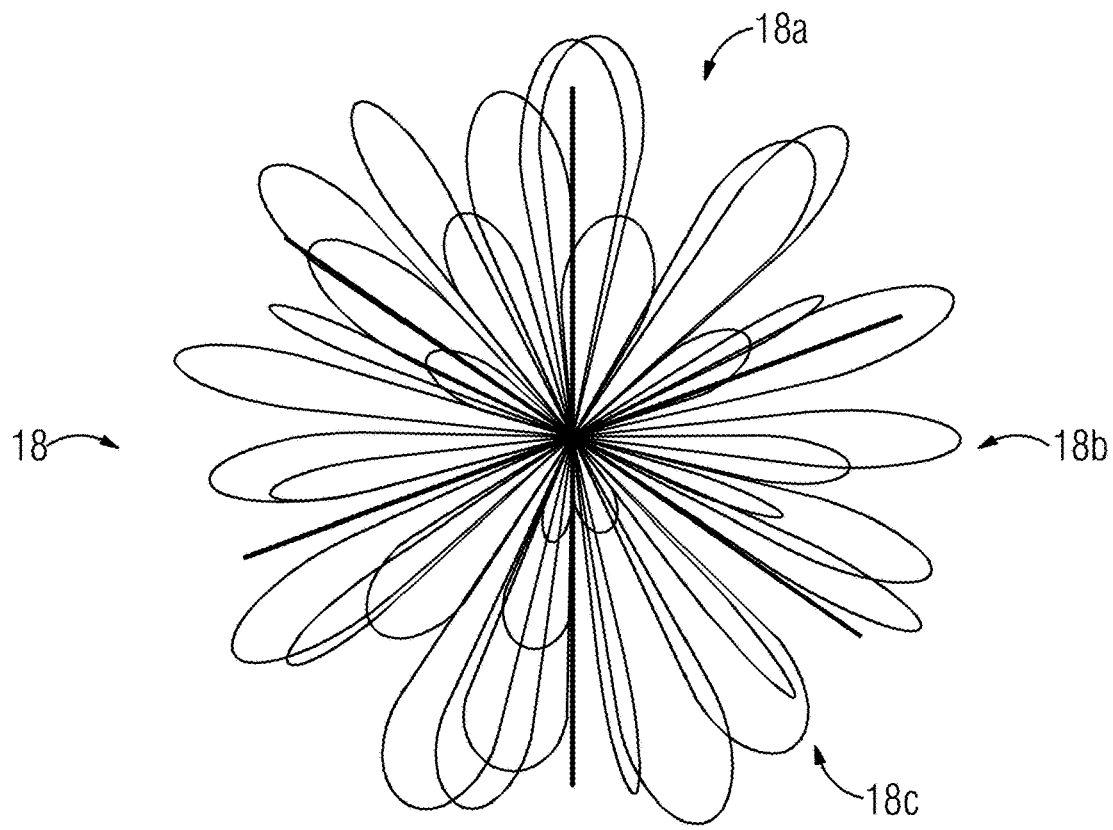
FIG. 3 illustrates schematically a k-space trajectory according to a further exemplary implementation of a method according to one or more embodiments of the disclosure.

Therein, during the acquisition period, the MR data is acquired by sampling a trajectory segment 18$a$ of a three-dimensional k-space trajectory 18 (see FIG. 3), wherein a k-space center is sampled multiple times during the acquisition period by the trajectory segment 18$a$. Furthermore, during the further acquisition period, the further MR data is for example acquired by sampling a further trajectory segment 18$b$ of the k-space trajectory 18, wherein the k-space center is again sampled multiple times during the further acquisition period by the further trajectory segment 18$b$.

Optionally, yet further acquisition periods and yet further trajectory segments, during the same or further shots, are used to sample the full k-space trajectory 18.

In an embodiment, a multi-slab diffusion-encoded 3D-TGSE pulse sequence with a 3D segmented radial k-space trajectory 18 as shown in FIG. 2, also referred to as 3D-rosette trajectory, may be used. According to the TGSE technique, a pulse sequence as in FIG. 2 may be used. After the initial excitation, RF pulse 16 follows the diffusion encoding module to apply the diffusion gradient 13*x*, 13*y*, 13*z* by means of a monopolar or bipolar diffusion gradient scheme.

Consequently, a predefined number of connected trajectory segments 18*a*, 18*b*, 18*c*, is measured in the 3D k-space. The first trajectory segment 18*a* corresponds to the first readout after the diffusion encoding module, namely the acquisition period, and may start directly in the k-space center and is directed towards the k-space periphery. When a maximum radial distance in k-space, $k_{max}$ is reached, the first trajectory segment 18*a* is directed towards the k-space center again to generate a second echo. Several further loops or spokes may follow, each generating a unique echo.

Once a predefined number of $N_{EPI}$ echoes have been acquired consecutively, a 180° refocusing RF pulse 17*b* pulse is used to reverse spin dephasing due to magnetic field inhomogeneities. Thereby, image artifacts like distortion and signal cancellations are reduced. After the refocusing RF pulse 18*b*, another $N_{EPI}$ echoes are acquired. The total number of echoes that can be acquired after a single excitation and diffusion encoding module is therefore given by $N=N_{EPI}*N_{SE}$, wherein $N_{SE}$ denotes the number of refocusing RF pulses.

While the described approach to 3D diffusion-weighted imaging would benefit from the 3D-encoding, regarding improved SNR, further steps may be taken.

Figure 4:
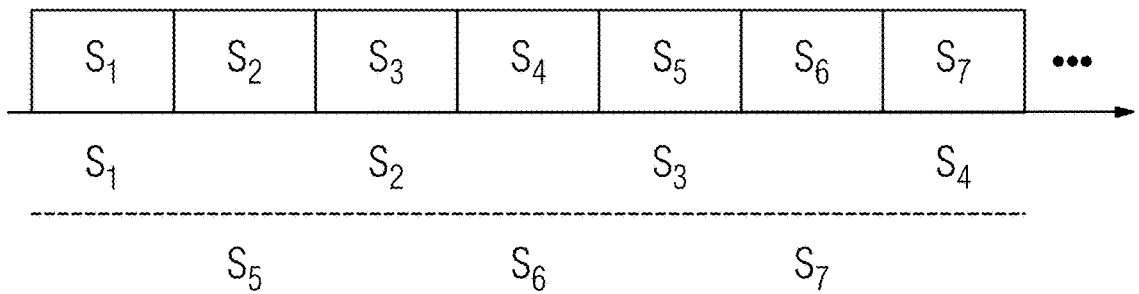
FIG. 4 illustrates schematically an excitation order of multiple slabs according to a further exemplary implementation of a method according to one or more embodiments of the disclosure.

To this end, the volume of the object 8 that is to be covered is divided into several different slabs S1, S2, S3, S4, S5, S6, S7, as depicted schematically in FIG. 4. This multi-slab approach enables the utilization of long repetition times TR, which are particularly beneficial for DWI. The multiple slabs S1, S2, S3, S4, S5, S6, S7 are excited and sampled in an interleaved manner to minimize cross-talk saturation effects. In the example of FIG. 4, the order of excitation and sampling is, for example, S1-S5-S2-S6-S3-S7-S4. From each slab S1, S2, S3, S4, S5, S6, S7, multiple individual slices may be reconstructed, such that the entire image volume is covered with the prescribed slice thickness.

For example, considering a slice range, also denoted as field of view (FOV) of 200 mm to be covered at a desired slice thickness of 1 mm in 10 slabs with a slab thickness of 20 mm (disregarding oversampling), 20 slices per slab are necessary, resulting in 200 slices all together.

The k-space trajectory 18 is used to sample each of the individual slabs S1, S2, S3, S4, S5, S6, S7. For example, a segmented 3D radial k-space trajectory 18, also denoted as 3D-rosette k-space trajectory may be used, which is represented by the following Equations:

$$k_x = k_{max} \sin(2\pi f_1 t)\cos(2\pi f_2 t)\cos(2\pi f_3 t),$$

$$k_y = k_{max} \sin(2\pi f_1 t)\sin(2\pi f_2 t)\cos(2\pi f_3 t),$$

$$k_z = k_{max} \sin(2\pi f_1 t)\sin(2\pi f_3 t),$$

wherein $k_{max}$ represents a predefined maximum radial distance from the k-space center, $f_1$ represents a predefined first frequency, $f_2$ represents a predefined second frequency, $f_3$ represents a predefined third frequency, wherein the first frequency differs from the second frequency and/or the first frequency differs from the third frequency. In other words, the trajectory segment is a part of the rosette trajectory as mentioned above.

Thereby, the k-space center is inherently measured after each excitation, and the MR signals themselves can therefore be used instead of a dedicated navigator signal.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. A method for performing three-dimensional diffusion weighted magnetic resonance imaging (DWI), comprising:
   applying a diffusion gradient by controlling a gradient coil arrangement of a magnetic resonance imaging (MRI) system; and
   during an acquisition period that occurs after the application of the diffusion gradient, applying a readout gradient by controlling the gradient coil arrangement and acquiring MR data,
   wherein for applying the readout gradient, the gradient coil arrangement is controlled such that the MR data is acquired along a trajectory segment of a three-dimensional k-space trajectory, and
   wherein a k-space center is sampled by the trajectory segment multiple times during the acquisition period.

2. A magnetic resonance imaging (MRI) system configured to perform three-dimensional diffusion weighted magnetic resonance imaging (DWI), the MRI system comprising:
   a gradient coil arrangement;
   control circuitry configured to control the gradient coil arrangement to apply a diffusion gradient and to apply a readout gradient during an acquisition period after the application of the diffusion gradient; and
   a readout coil arrangement configured to acquire MR data during the acquisition period,
   wherein the control circuitry is configured to control the gradient coil arrangement for applying the readout gradient such that the MR data is acquired along a trajectory segment of a three-dimensional k-space trajectory, and
   wherein a k-space center is sampled by the trajectory segment multiple times during the acquisition period.

3. The method according to claim 1, wherein for each one of the multiple samplings of the k-space center during the acquisition period, the trajectory segment passes through the k-space center, ends at the k-space center, or starts at the k-space center.

4. The method according to claim 1, wherein the multiple samplings of the k-space center during the acquisition period correspond to multiple directions of the trajectory segment.

5. The method according to claim 1, wherein:
   the trajectory segment is represented by a curve in the form:
   $(k_x(t), k_y(t), k_z(t))$ for $0 \leq t \leq T$, with t representing a time, and T representing a predefined acquisition time, the three-dimensional k-space trajectory is represented in accordance with:

$$k_x = k_{max} \sin(2\pi f_1 t)\cos(2\pi f_2 t)\cos(2\pi f_3 t),$$

$$k_y = k_{max} \sin(2\pi f_1 t)\sin(2\pi f_2 t)\cos(2\pi f_3 t), \text{ and}$$

$$K_z = k_{max} \sin(2\pi f_1 t)\sin(2\pi f_3 t),$$

$k_{max}$ represents a predefined maximum radial distance from the k-space center,
$f_1$ represents a predefined first frequency,
$f_2$ represents a predefined second frequency,
$f_3$ represents a predefined third frequency, and
the first predefined frequency differs from the second predefined frequency and/or the first predefined frequency differs from the third predefined frequency.

6. The method according to claim 1, further comprising:
applying, after the acquisition period, a refocusing RF pulse;
applying, during a further acquisition period after the application of the refocusing RF pulse, a further readout gradient by controlling the gradient coil arrangement, and acquiring further MR data, and wherein:
applying the further readout gradient comprises controlling the gradient coil arrangement such that the further MR data is acquired along a further trajectory segment of the k-space trajectory,
the further trajectory segment differs from the trajectory segment, and
the k-space center is sampled by the further trajectory segment multiple times during the further acquisition period.

7. The method according to claim 1, further comprising:
applying, prior to the application of the diffusion gradient, a slice selection gradient to excite a slab corresponding to two or more adjacent slices of an object to be imaged; and
detecting an MR signal emitted by the excited slab during the acquisition period to acquire the MR data.

8. The method according to claim 1, wherein a plurality of slabs, each slab corresponding to two or more respective slices of an object to be imaged, is excited in a predefined order, and
wherein between each pair of subsequently excited slabs, at least one further slab of the plurality of slabs is located.

9. The method according to claim 1, wherein the method is carried out according to a turbo-gradient-spin-echo (TGSE) technique.

10. The method according to claim 1, wherein a three-dimensional image reconstruction is carried out using the MR data.

11. The MRI system according to claim 2, further comprising:
a transmitting coil arrangement, wherein:
the control circuitry is configured to control the transmitting coil arrangement to apply a refocusing RF pulse after the acquisition period, and to control the gradient coil arrangement to apply a further readout gradient during a further acquisition period after the application of the refocusing RF pulse;
the readout coil arrangement is configured to acquire further MR data during the further acquisition period;
the control circuitry is configured to control the gradient coil arrangement for applying the further readout gradient such that the further MR data is acquired along a further trajectory segment of the k-space trajectory,
the further trajectory segment differs from the trajectory segment, and
the k-space center is sampled by the further trajectory segment multiple times during the further acquisition period.

12. The MRI system according to claim 2, further comprising:
processing circuitry configured to perform a three-dimensional image reconstruction using the MR data.

13. The method according to claim 1, wherein the readout gradient is applied in each respective one of three directions in k-space.

14. The method according to claim 1, wherein the applying the diffusion gradient comprises applying a diffusion gradient in each respective one of an x-, y-, and z-axis, and
wherein the applying the readout gradient comprises applying, after each diffusion gradient is applied in the x-, y-, and z-axis, a respective readout gradient in the x-, y-, and z-axis.

15. The method according to claim 1, wherein no Cartesian component of the three-dimensional k-space trajectory is constant along an entirety thereof.

16. The method according to claim 5, wherein each one of the first predefined frequency, the second predefined frequency, and the third predefined frequency differ from one another.

17. The method according to claim 5, wherein:
the first predefined frequency is greater than the second predefined frequency, and
the first predefined frequency is greater than the third predefined frequency.

18. The method according to claim 10, wherein the three-dimensional image reconstruction is carried out without using data acquired by means of a navigator scan.

19. The method according to claim 13, wherein the readout gradient applied in each respective one of three directions in k-space comprises a non-zero amplitude at least once during the acquisition period.

20. The method according to claim 14, further comprising:
applying, after the acquisition period, a refocusing RF pulse;
applying, during a further acquisition period after the application of the refocusing RF pulse, a further readout gradient comprising a respective readout gradient in the x-, y-, and z-axis.

* * * * *